US009134705B2

(12) United States Patent
Vardi

(10) Patent No.: US 9,134,705 B2
(45) Date of Patent: Sep. 15, 2015

(54) TUNING-FORK RESONATOR FOR MECHANICAL CLOCK MOVEMENT

(71) Applicant: Asgalium Unitec SA, Cortaillod (CH)

(72) Inventor: Ilan Vardi, Paris (FR)

(73) Assignee: Asgalium Unitec SA (CH)

( * ) Notice: Subject to any disclaimer, the term of this patent is extended or adjusted under 35 U.S.C. 154(b) by 0 days.

(21) Appl. No.: 14/348,317

(22) PCT Filed: Sep. 27, 2012

(86) PCT No.: PCT/EP2012/069122
§ 371 (c)(1),
(2) Date: Mar. 28, 2014

(87) PCT Pub. No.: WO2013/045573
PCT Pub. Date: Apr. 4, 2013

(65) Prior Publication Data

US 2014/0247703 A1 Sep. 4, 2014

(30) Foreign Application Priority Data

Sep. 29, 2011 (EP) .................................... 11183371

(51) Int. Cl.
*G04B 15/00* (2006.01)
*H03B 5/30* (2006.01)
*G04C 5/00* (2006.01)
*G04B 15/08* (2006.01)
*G04B 15/14* (2006.01)
(Continued)

(52) U.S. Cl.
CPC ................ *G04C 5/005* (2013.01); *G04B 15/08* (2013.01); *G04B 15/14* (2013.01); *G04B 17/00* (2013.01); *G04B 17/045* (2013.01)

(58) Field of Classification Search
USPC ............. 368/124–129; 331/73, 139, 155–156
See application file for complete search history.

(56) References Cited

U.S. PATENT DOCUMENTS 2,971,323 A 2/1961 Hetzel
3,204,133 A 8/1965 Tschudin
(Continued)

FOREIGN PATENT DOCUMENTS

CH 442153 A 3/1967
CH 594201 B5 12/1977
(Continued)

OTHER PUBLICATIONS http://electric-clocks.nl/clocks/nl/pagina07.htm—Dec. 23, 2014.*
(Continued)

*Primary Examiner* — Sean Kayes
(74) *Attorney, Agent, or Firm* — The Webb Law Firm

(57) ABSTRACT

A tuning-fork mechanical resonator for a mechanical clock movement with free escapement includes an oscillator of the tuning fork type, of which at least one first prong is intended to oscillate about a first axis and bears at least one first pin associated with at least one first fork tooth of a pallet assembly to cause this assembly to pivot between first and second angular positions and alternately lock and release an escapement wheel. The resonator comprises a conversion member secured to the first pin and designed to on the one hand, convert the oscillations of the first prong of the oscillator into rotational movements of the pallet assembly by transmitting first impulses thereto, and on the other hand, transmit mechanical energy from the pallet assembly to the first prong of the oscillator in the form of impulses.

20 Claims, 7 Drawing Sheets

(51) Int. Cl.
*G04B 17/04* (2006.01)
*G04B 17/00* (2006.01)

(56) References Cited

U.S. PATENT DOCUMENTS

| | | | | | |
|---|---|---|---|---|---|
| 3,208,287 | A | | 9/1965 | Ishikawa et al. | |
| 3,250,066 | A | * | 5/1966 | Engelhardt et al. | 368/86 |
| 3,282,042 | A | * | 11/1966 | Schaller | 368/157 |
| 3,433,009 | A | * | 3/1969 | Haag | 368/167 |
| 3,447,311 | A | | 6/1969 | Beyner et al. | |
| 3,548,585 | A | * | 12/1970 | Chopard et al. | 368/167 |
| 3,616,638 | A | * | 11/1971 | Bennett | 368/159 |
| 3,748,845 | A | * | 7/1973 | Mutter et al. | 368/159 |
| 3,877,215 | A | * | 4/1975 | Burckhardt et al. | 368/163 |

FOREIGN PATENT DOCUMENTS

| | | | |
|---|---|---|---|
| DE | 1807377 | A1 | 6/1969 |
| FR | 73414 | A | 10/1866 |
| GB | 1306756 | A | 2/1973 |

OTHER PUBLICATIONS

Translation NPL #2 translate.google.com/ May 2, 2015.*
Breguet, Forum entry by the MIH describing the operation of the Breguet Clock, http://mb.nawcc.orgishowthread. php?53511-Aug.-Tuning-Fork-Clock-Louis-C1%C3%A9ment-Breguet, at least as early as 2009.
Breguet, Animation of the Breguet Clock No. 1150, www.electric-clocks.nl/clocks/animations/AnimationT-Brequet.htm, at least as early as 2007.
Breguet, "Application of the Tuning-Fork to Horology," The London, Edinburg and Dublin Philosophical Magazine and Journal of Science, Jan. 1867, p. 240.
Breguet, Photographs of a Breguet Clock No. 1150 acquired by the Musee International d'Horlogeric (MIH) of La Chanx-de-Fonds in 1967 and exposed to the public since at least 1997.
Breguet, Transcription of Public Presentation, Compte-Renda des Seances de l'Academicdes Sciences, 1866.

* cited by examiner

Fig. 6e
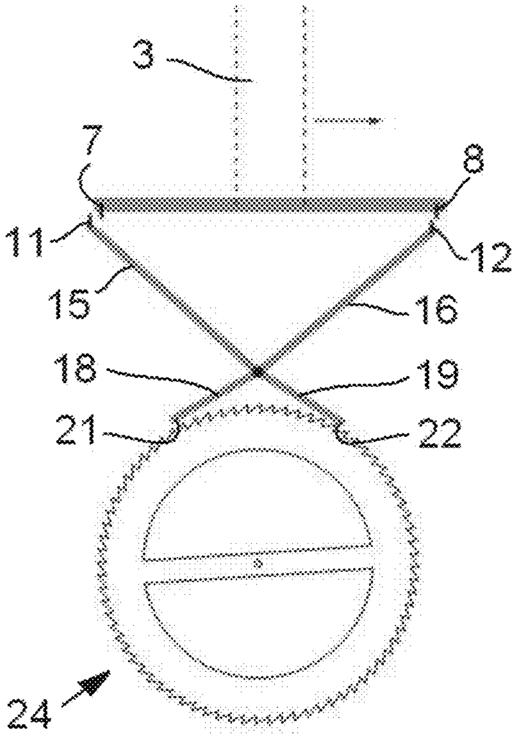
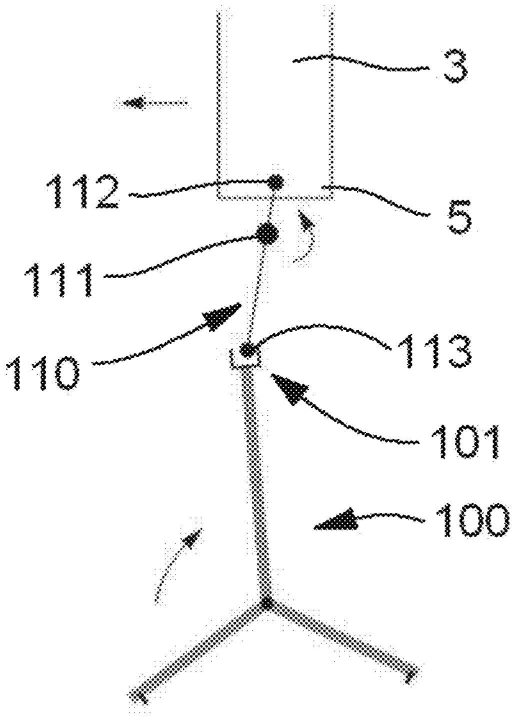
Fig. 7

TUNING-FORK RESONATOR FOR MECHANICAL CLOCK MOVEMENT

CROSS REFERENCE TO RELATED APPLICATIONS

This application is the United States national phase of International Application No. PCT/EP2012/069122 filed Sep. 27, 2012, and claims priority to European Patent Application No. 11183371.1 filed Sep. 29, 2011 the disclosures of which are hereby incorporated in their entirely by reference.

BACKGROUND OF THE INVENTION

1. Field of the Invention

The present invention relates to a tuning-fork mechanical resonator for a mechanical clock movement with free escapement, comprising an oscillator of the tuning fork type, of which at least one first oscillating prong is intended to oscillate about a first axis and bears at least one first pin associated with at least one first fork tooth of a pallet assembly to cause this assembly to pivot between first and second angular positions and alternately lock and release an escapement wheel.

In the known way, such a mechanism makes it possible, in conjunction with a source of mechanical energy, to sustain the oscillations of the oscillator that is the tuning fork and thus define a resonator.

The high quality factor of an oscillator such as a tuning fork, namely around ten to fifty times as high as that of a conventional balance spring oscillator, makes it attractive for horology applications.

Moreover, the present invention also relates to a clock movement fitted with such a resonator and to a timepiece, particularly although not exclusively of the wristwatch type, fitted with such a clock movement.

2. Description of Related Art

Many horology devices comprising a tuning fork by way of an oscillator have already been disclosed in the prior art.

By way of example, patent FR 73414 A, granted in the name of Louis-François-Clément Breguet on the basis of an application filed in 1866, describes a pendulum clock the mechanical oscillator of which is a tuning fork. A first prong of this tuning fork bears a pin so as to be constrained to move within a hole provided in a pallet assembly having two arms designed to collaborate with an escapement wheel, in order alternately to lock and release the latter, the pallet assembly being mounted on a frame component of the clock movement so as to pivot. The escapement thus designed is not of the free escapement type because, on the one hand, the pallet assembly is in permanent contact with the escapement wheel and, on the other hand, the pin fixes the pallet assembly to the prong of the tuning fork and therefore never leaves the pallet assembly. Such an escapement therefore has the corresponding disadvantages, namely in particular wear and chronometric disturbance both of which are greater than with a free escapement.

As far as wristwatches are concerned more particularly, Max Hetzel has been behind a great many patented inventions relating to the use of a tuning fork as an oscillator, which have led to the production of the Accutron (registered trade name) wristwatch marketed by the company Bulova Swiss SA.

The Accutron watch however comprises an electronic resonator given that each prong of the corresponding tuning fork bears a permanent magnet associated with an electromagnet mounted fixedly on the frame of the watch. The operation of each electromagnet is slaved to the vibrations of the tuning fork, via the magnets it carries, such that the vibrations of the tuning fork are sustained by the transmission of periodic magnetic impulses from the electromagnets to the permanent magnets. One of the prongs of the tuning fork operates a pawl that allows the wheels of the watch gear train to be turned. This construction does not lend itself to the use of the pawl for sustaining the oscillations of the tuning fork.

U.S. Pat. No. 2,971,323 for example, derived from a filing dating from 1957, describes such a mechanism which, however, cannot be used for creating a purely mechanical watch, i.e. a watch that has no electronic circuits. Indeed, in market terms, there is a real need for purely mechanical timepieces that run with greater precision than the known timepieces.

It should be pointed out that the Accutron timepiece is still currently marketed by the company Bulova Swiss SA.

Patent CH 594201, derived from a filing dating from 1972, describes a double-oscillator resonator system. The frequency stability of the oscillations of a tuning fork is put to use, through magnetic interaction, to stabilize the oscillations of a balance of conventional form, which therefore has a lower quality factor than the tuning fork. To this end, the prongs of the tuning fork, on the one hand, and the balance on the other hand, bear permanent magnets designed to collaborate with one another. The corresponding interaction makes it possible both to sustain the oscillations of the tuning fork and to stabilize the oscillations of the balance in terms of frequency.

However, although that is not explicitly evident in that patent, it is obvious that this mechanism has to be coupled to a mechanical escapement in order to convert the periodic oscillations of the balance into a one-way movement capable of driving the wheels of a gear train. Thus, it is probable that the balance is coupled to a conventional mechanical escapement designed to sustain the oscillations thereof. As a result, the mechanism described in that document allows an improvement in the frequency stability of the oscillations of a balance, but does so at the expense of a complexity and a bulkiness that are far higher than those of a conventional mechanism with just one oscillator. Further, the high quality factor of the tuning fork is only partially put to use in the solution presented because, in the end analysis, it is the balance that controls the movements of the gear train, in a similar way to the operation of conventional systems.

Alternative solutions better suited to the spatial constraints specific to the construction of a wristwatch, have also been disclosed. Specifically, U.S. Pat. No. 3,208,287, derived from a filing dating from 1962, describes a resonator comprising a tuning fork coupled to an escapement wheel via magnetic interactions. More specifically, the tuning fork bears permanent magnets collaborating with the escapement wheel, the latter being made from a magnetically conducting material. The escapement wheel is kinematically connected to a source of energy which may be mechanical or take the form of a motor, whereas it has openings, in its thickness, such that it forms a magnetic circuit of variable reluctance when driven in rotation, in relation to the magnets borne by the tuning fork.

Therefore, permanent interaction of substantial intensity occurs, between the tuning fork and the escapement wheel, that can be qualified as magnetic locking, such a construction therefore consisting of a non-free escapement. The supply of energy from the escapement wheel to the tuning fork in order to sustain the oscillations thereof, even though small, occurs continuously and constitutes a source of disruption that is not insignificant in terms of the isochronism of these oscillations. Likewise, the escapement wheel is continuously guided by the tuning fork.

Thus, the type of interaction used in this construction is similar to a contact, and this is detrimental from a precision operation standpoint.

Leaving the Louis-Francois-Clement Breguet pendulum clock to one side, all of these mechanisms use a magnetic interaction and none lends itself to the creation of a purely mechanical timepiece, namely one that contains neither electronics nor magnetic interaction.

SUMMARY OF THE INVENTION

It is a main objective of the present invention to alleviate the disadvantages of the tuning-fork resonators known from the prior art by proposing a resonator for a mechanical timepiece, particularly for a wristwatch, that has a high quality factor and a high degree of isochronism, and an escapement of the free escapement type.

There are a certain number of technical problems that arise when using an oscillator of the tuning fork type in a watch in conjunction with a free escapement, particularly in a wristwatch.

The frequency of oscillation of a tuning fork is far higher than that of a balance spring. By way of example, the aforementioned Accutron has a tuning fork that vibrates at a frequency of 360 Hz, as compared with the 4 Hz of the balance spring of most current mechanical watches. Thus, adapting a conventional free escapement so that it can work in conjunction with a tuning fork is not an obvious undertaking. Furthermore, the higher frequency of vibration of the tuning fork ought to lead to greater expenditure of energy and greater component wear than with a balance spring.

The amplitude of vibrations of a horology tuning fork is small. By way of example, the amplitude of the vibrations of the tuning fork in the Accutron is 0.036 mm, as compared with the amplitude of oscillations of the balance pin in a balance spring system, which is of the order of 2 mm.

Such a small amplitude makes the escapement components more difficult to produce than is the case with use of a balance spring.

In addition, the higher operating frequency and the small amplitude mean that the corresponding escapement would need to act over a greater portion of the oscillation of the tuning fork and that the perturbation due to the escapement would therefore be greater than in the conventional case.

An additional problem lies in the fact that the oscillatory movement of the legs or prongs of the tuning fork is almost linear, as compared with the circular movement of the balance. Thus, the axial movement of the tip of the prong of a tuning fork is very small.

This linear movement means that modifications need to be made to the components of the escapement because, in particular, the matter of how a pin enters and exits a pallet assembly fork becomes problematical.

Furthermore, it will be noted that the lateral amplitude of the oscillations of a tuning-fork prong, i.e. in a direction substantially perpendicular to the direction of the prong, is liable to vary greatly, up to 50% in relation to a mean value according to Max Hetzel. Because of this variation, the pin needs to be able to leave the fork in order not to be impeded over an additional arc that is longer than average, i.e. to ensure that the oscillator can vibrate freely during the additional arc, this being a condition necessary to the production of a free escapement. It is therefore necessary to overcome the difficulty associated with the problem set of the pin entering and leaving the pallet assembly fork.

Finally, it can also be revealed that the use of a tuning fork in a wristwatch presents a problem in terms of size. Indeed the tuning fork used in the Accutron model has a length of the order of 25 mm, as compared with the commonplace diameter of a balance, which is of the order of 10 mm.

Having checked the feasibility of a resonator of the type mentioned above in terms of operating frequency and energy consumption, the applicant has labored to solve the problems residing in the construction of a resonator that allows the small amplitude of the oscillations of the prongs of a tuning fork to be taken into consideration.

Specifically, the calculations performed by the applicant have led to the conclusion that, for example, a tuning fork vibrating at a frequency of 50 Hz with a vibrations amplitude of 0.07 mm expends a similar level of energy to a conventional balance spring. Furthermore, for such a tuning fork, an escapement which acts only over 50% of the amplitude of the vibrations of the leg of the tuning fork leads only to an increase in the chronometric error by a factor of 33%, thus confirming the feasibility of such a system.

With a view to addressing the overall technical problem mentioned hereinabove, it becomes apparent that the present invention relates more particularly to a resonator of the type described hereinabove, which may comprise a conversion member secured to the first pin and designed to on the one hand, convert the oscillations of the first prong of the oscillator into rotational movements of the pallet assembly by transmitting first impulses thereto, and on the other hand, transmit mechanical energy from the pallet assembly to the first prong of the oscillator in the form of impulses, such that the first tooth may have an amplitude of axial movement, namely substantially in the direction of the first axis, as the pallet assembly pivots, that is greater than the amplitude of movement of the first pin substantially in the direction of the first axis.

Specifically, it emerges from the foregoing geometric considerations that in the conventional oscillator-pallet assembly-escapement system, the impulse pin, secured to the oscillator and operating the pallet assembly to disengage the escapement wheel, has an amplitude of axial movement, considering here the axis of the pallet assembly when it is oriented in the direction of the axis of the balance, that is greater than that of the pallet assembly. Now, when the oscillator is a tuning fork, it has been found that the amplitude of the axial movements of the ends of its legs is not enough to ensure that the pin enters the pallet assembly fork, or likewise exits the fork.

So, the present invention provides for the amplitude of the axial movements of the teeth of the pallet assembly fork to be greater than that of the pin, a conversion member being provided to ensure correct collaboration between these elements and ultimately to allow a free escapement to operate correctly.

The conversion member may be produced in various forms without departing from the scope of the present invention.

According to a first embodiment, provision may be made for it to comprise a lever, intended to be pivot-mounted on a frame element of the clock movement and secured to the first pin so as to be able to pivot in relation to the first prong of the oscillator, the lever bearing a second pin intended to collaborate with the first tooth and with a second tooth of the fork in order to cause the pallet assembly to pivot.

According to a preferred alternative embodiment, it may comprise a support arranged on the first prong of the oscillator and bearing the first pin and a second pin, these pins being intended to collaborate alternately and respectively with the first fork tooth and with a second fork tooth and being situated at a relative distance that is slightly smaller than the relative distance between the first and second fork teeth.

By virtue of these features, the present invention makes it possible to use a mechanical resonator for a timepiece that comprises a tuning fork associated with a free escapement.

Advantageously, the pallet assembly may comprise a frame having first and second arms respectively bearing the first and second fork teeth.

In a preferred alternative form, the pallet assembly may be secured to a pallet assembly staff intended to allow it to be mounted on the clock movement, the first and second arms extending substantially from the pallet staff.

Various alternative forms of embodiment are conceivable, depending on the constraints that have to be observed in terms of bulkiness in particular. Thus, the pallet assembly may comprise first and second additional arms intended to collaborate alternately with the escapement wheel, these first and second arms, on the one hand, and the first and second additional arms, on the other hand, all of which may either be arranged in one and the same plane, or in two distinct planes.

Moreover, provision may also be made for the resonator to comprise a second escapement wheel designed to collaborate either with the same pallet assembly or with an additional pallet assembly designed to collaborate with the second prong of the oscillator.

BRIEF DESCRIPTION OF THE DRAWINGS

Further features and advantages of the present invention will become more clearly apparent from reading the detailed description which follows of some preferred embodiments, which description is given with reference to the attached drawings given by way of nonlimiting examples and in which:

FIGS. 6*a*, 6*b*, 6*c*, 6*d* and 6*e* are detail views of the operation of the resonator of FIG. 2, in successive configurations, and FIG. 7 is a schematic front view of a mechanical resonator for a clock movement according to a second embodiment of the present invention.

DESCRIPTION OF THE INVENTION

Figure 1A:
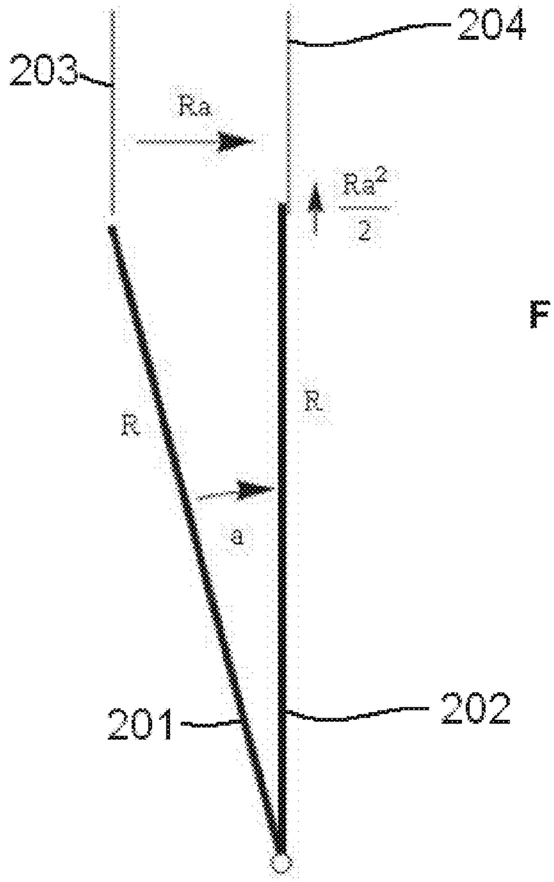
FIGS. 1*a* and 1*b* are illustrative diagrams of the constraints to be taken into consideration when implementing the present invention.
Figure 1B:
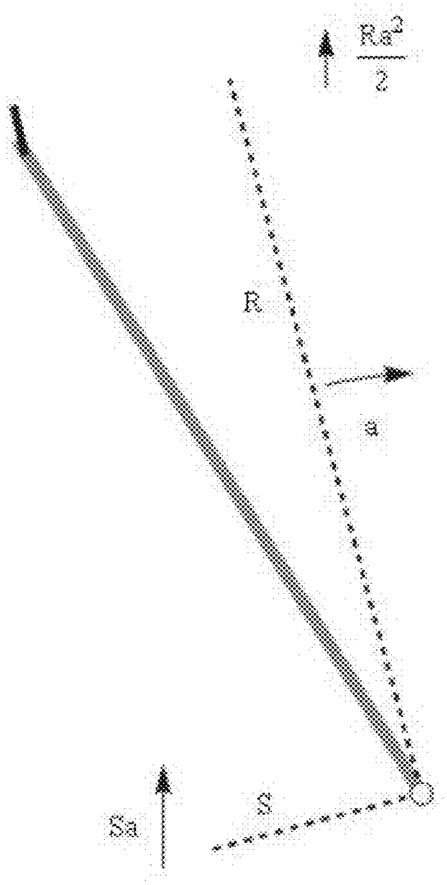

FIGS. 1*a* and 1*b* are illustrative diagrams of constraints to be taken into consideration when implementing the present invention, more specifically in terms of geometries to be respected to ensure correct collaboration between a tuning-fork prong and an escapement pallet assembly fork.

FIG. 1*a* schematically illustrates the movement of a pallet assembly, of radius R, in order to assess what relationship there is between the angle of rotation it covers, between first and second radii, and the movement of its tip in the direction of the second radius, i.e. substantially along the axis of the tuning fork prong.

The thick lines 201 and 202 illustrate the first and second positions that the pallet assembly can adopt as it pivots in response to an impulse transmitted by a tuning fork prong, indicated schematically by the thin lines 203 and 204.

More specifically, when the pallet assembly is in the position of line 201, the tuning fork prong (line 203) needs to be able to move past a first of its fork teeth without touching it, whereas when it is in the position of line 202, it needs to be able to transmit an impulse to the tuning fork prong (line 204) using the other tooth of its fork, in order to sustain the oscillations of the tuning fork.

The axial movement of the tip of the pallet assembly, namely in the direction of the tuning fork prong is given by:

$$R\cos a - R = R\left(1 - \frac{a^2}{2} + \ldots\ - 1\right) \approx -\frac{Ra^2}{2}.$$

It is clear from that that the axial movement of the pallet assembly is of a smaller order than its angle of rotation.

For the usual order of magnitude of a pallet assembly of conventional shape, i.e. with parallel teeth and a length of the order of 2.1 mm, the pallet assembly having a pivoting of 5 degrees, the above formula gives an axial movement of its tip of around 0.008 mm, i.e. less than one hundredth of a millimeter.

In general, the unlocking phase corresponds to approximately 2 degrees of pivoting of the pallet assembly. Thus, when the tuning fork prong leaves a first tooth of the fork after having pushed it, the pallet assembly still has 3 degrees of pivoting left during which the other tooth needs to move axially far enough to be able to transmit an impulse to the prong of the tuning fork. This 3-degree angle corresponds to an axial movement of 0.005 mm.

Considering the case of a conventional impulse pin, having a lift phase representing an angle of 30 degrees, the lift begins for an angle of the order of 15 degrees and ends at an angle of the order of 9 degrees. In that case, the axial movement of the pin is generally of the order of 0.046 mm (for a pin path of radius 0.7 mm), giving a relative axial movement of the order of 0.05 mm between the pin and the corresponding fork tooth of the pallet assembly.

If it is conceded that the overlap between the tooth and the pin is around 0.025 mm at the end of unlocking, there are still 0.025 mm of clearance between the tooth and the pin to allow the latter to enter the fork. Such dimensions are very small, at the limit of practical production.

It is for this reason that the fork has a well defined width, to make it easier for the pin to enter.

FIG. 1*b* schematically illustrates the movement of a fork of width 2S.

The width 2S of the fork makes it easier for the pin to enter the fork by contributing to the aforementioned axial movement because it is of the same order as the angle a: a rotation of a horizontal arm of length S through an angle a gives a vertical movement of –S.sin(a), namely approximately –S.a. Therefore, if the fork has a height R, in the axial direction, and the wall of each of its teeth is a distance S from the axis, then for a small rotation through an angle a, the axial movement caused by R is approximately $R.a^2$ and the movement due to S is approximately S.a.

For example, by positioning a fork wall 0.25 mm from the axis of its pallet assembly (which is the conventional order of magnitude for a conventional balance escapement), the axial movement of the wall is increased by 0.25.(sin(5°)–sin(3°))

namely around 0.009, which allows the passage dimension to be increased from 0.025 mm to 0.03 mm.

For the tuning fork, the situation is more complicated because the movement of its prong or leg is practically linear, whereas with the balance the impulse pin has a rotary movement.

For example, for a vertical prong of length R vibrating at an amplitude A, the vertical movement is $$\sqrt{R^2 - A^2} - R = R\left(1 - \frac{A^2}{2R^2} + \ldots - 1\right) \approx -\frac{A^2}{2R}.$$

which amounts to the same calculation if we note that the angle of rotation of the prong is a=arctan(A/R), namely approximately A/R.

By way of example, for the Accutron which has prongs 20 mm long, but only ⅔ of which is in apparent circular movement, and an amplitude of 0.036 mm, the vertical movement is −0.00005 mm, and therefore imperceptible for the application of interest here.

Similarly, for a tuning fork with a length of 20 mm, an amplitude of 0.07 mm and a pallet assembly of 2.1 mm with an unlocking from 1 degree to 0 degrees, the above calculations lead to the calculation of a vertical movement of the tuning fork prong of 0.0001 mm and a vertical movement of the pallet assembly of 0.0003 mm, namely a difference of 0.0004 mm, which is unacceptable.

It is therefore necessary to consider a fork of greater width that allows the pin to enter it.

Let us consider, for example, a fork with the walls at a distance S from the axis of the pallet assembly. The movement in a direction parallel to the axis between 1 degree and 0 degrees is therefor S.sin(1°), namely approximately 0.017.S. By setting S=2.5 mm, that gives an axial movement of 0.44 mm. Moreover, the pin on the tuning fork also turns through a certain angle. It can be calculated that it enters the fork at an amplitude of 0.035 mm, for a leg 20 mm long ⅔ of which are in rotation, this representing an angle of 0.002625=0.15 degrees, the axial movement being 0.0066 mm. That gives a relative movement of 0.045 mm, namely an entry of 0.022 mm.

Thus, in this basic example, the fork ought to have walls distant by at least 2.5 mm with reference to the axis of the pallet assembly, for a total length of 5 mm.

These calculations are based on the assumption that the vibrations of the tuning fork are approximately circular. In actual fact, the movement is more complex and reference ought to be made to the exact behavior of a bar deformed in bending for greater precision. The calculations given here are given by way of indication and therefore, in practice, the exact geometry of the fork will need to be adapted to suit the exact path of the tuning fork vibrations.

The above considerations have led the applicant to review the geometry of the fork and, therefore, that of the conventional impulse pin.

Figure 2:
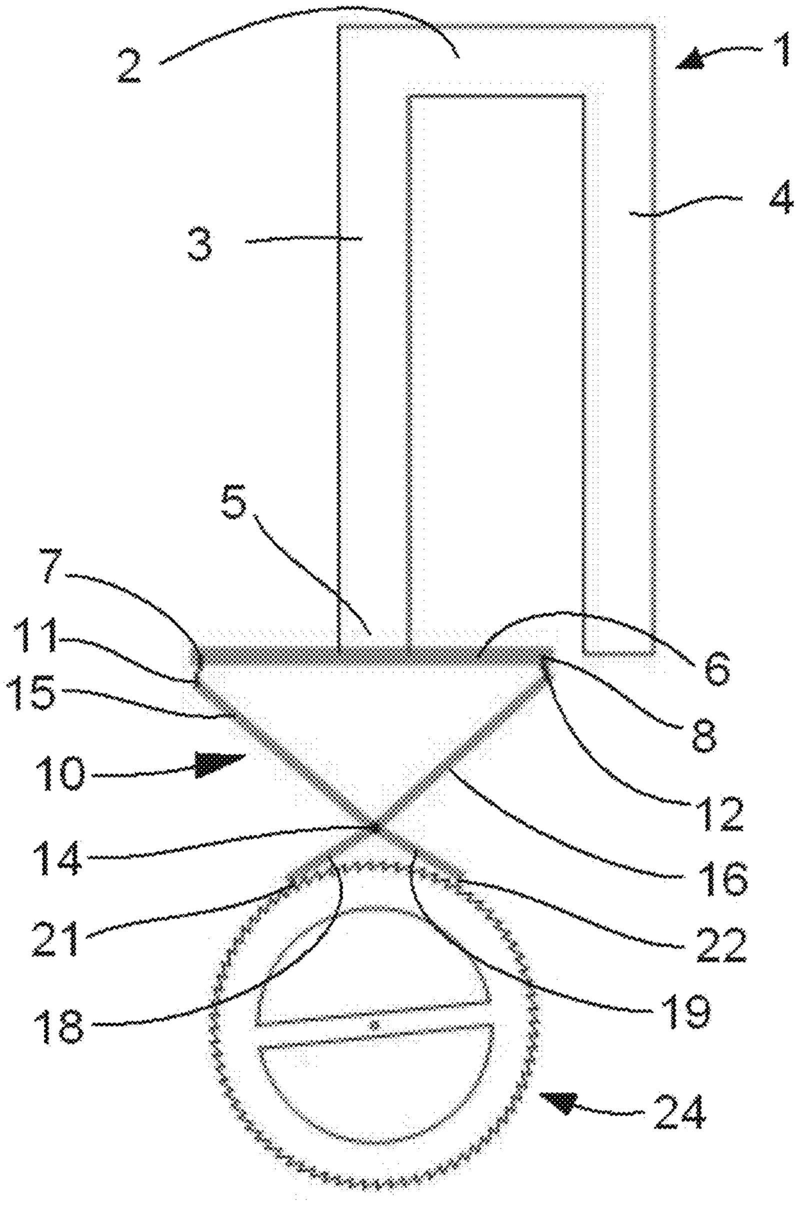
FIG. 2 is a schematic front view of a mechanical resonator for a clock movement according to a first embodiment of the present invention.

FIG. 2 is a schematic front view of a mechanical resonator for a clock movement according to a first embodiment of the present invention.

This resonator comprises an oscillator 1 of the tuning fork type, here substantially U-shaped nonlimitingly, the base 2 of which is intended to be secured to a frame element of a clock movement (which for the sake of greater clarity has not been illustrated), so as to allow the prongs 3 and 4 to vibrate with reference to the base, in the known way.

As an alternative, the tuning fork could have a different shape, for example and preferably a shape similar to the one described and illustrated in U.S. Pat. No. 3,447,311.

As mentioned earlier, the amplitude of the vibrations of the tuning fork is very small and would not be suited to the creation of a conventional resonator simply by replacing the balance spring system with a tuning fork.

Therefore the applicant has conducted research in order to develop a mechanical resonator with tuning fork for a clock movement comprising a conversion member designed to

- on the one hand, convert the movements of a tuning fork prong into rotational movements of a pallet assembly by transmitting first impulses to the latter, and
- on the other hand, transmit mechanical energy from the pallet assembly to the prong of the tuning fork in the form of impulses,
- in such a way that the teeth of the pallet assembly fork have an amplitude of axial movement, namely movement substantially in the direction of the axis of the tuning fork prong, as the pallet assembly pivots, that is greater than the amplitude of movement of the tip of the tuning fork prong substantially in its axial direction.

FIG. 2 illustrates one embodiment of a resonator according to one illustrative example of the invention.

The free end or tip 5 of a first prong 3 of the tuning fork is provided with a support 6 carrying first and second pins 7 and 8 performing the function of the impulse pin in a conventional system, as will become evident from the detailed description of FIGS. 6*a* to 6*e*.

The support 6 has an elongate shape, in a direction substantially perpendicular to the direction of the first prong 3, being fixed to the latter by its middle, the pins 7, 8 being arranged at its respective ends.

The pins 7, 8 cooperate with a pallet assembly 10, more specifically with first and second teeth 11 and 12 of the pallet assembly defining a pallet assembly fork.

The pallet assembly 10 comprises a frame intended to be pivot mounted on a frame element of the clock movement via a pallet assembly staff 14. The frame has first and second arms 15, 16 extending from the pallet assembly staff and each of which bears one of the teeth 11, 12 at its free end.

The frame also has first and second additional arms 18, 19 likewise extending from the pallet assembly staff 14 and respectively bearing first and second pallets 21, 22 designed to collaborate with the teethset of an escapement wheel 24 in a substantially conventional way. Thus, the pallet assembly 10 is intended to pivot between a first position in which one of its pallets 21, 22 locks the escapement wheel 24 in terms of rotation and a second position in which the other pallet locks the escapement wheel. When the pallet assembly pivots between one position and the other, the escapement wheel is free to turn.

The distance between the pins 7 and 8 is slightly smaller than the distance between the teeth 11 and 12 in order to ensure that the resonator operates correctly.

It is evident from FIG. 2 that the resonator according to the present invention allows operation similar to that of conventional resonators, notably by virtue of the fact that the oscillator bears two pins 7 and 8 rather than a single pin, and by virtue of the special geometry of the pallet assembly fork. The solution illustrated by way of nonlimiting indication makes it possible not only to give the pallet assembly an amplitude of rotation that is enough for it to collaborate correctly with the escapement wheel, but also to ensure that the pins 7 and 8 can, each in turn, enter the fork and drive the pallet assembly in a suitable way, and that they can also leave the fork, symmetrically.

Of course a person skilled in the art will be able to adapt the number of teeth of the escapement wheel or the lever arms between the various arms of the pallet assembly to suit his own requirements and without departing from the scope of the present invention.

In particular, it will be noted that the lever arm of the pallet assembly can be altered by altering the distances between the pallet assembly staff and the teeth of the fork, on the one hand, and between the pallet assembly staff and the pallets, on the other hand, in order to adapt the geometry of the pallet assembly to suit the need. Specifically, reducing the lever arm of the fork allows an increase in the angle of rotation of the pallet assembly and therefore in the amplitude of movement of the pallets.

Furthermore, it will also be noted that reducing the lever arm of the fork makes the escapement easier to construct because it results in an enlarging of the locking area of the pallet and the width thereof. Increasing the angle of rotation of the pallet assembly increases the movement of the fork in the axial direction of the pallet assembly, making it easier for the pin or pins to enter and leave the fork. The width of the fork can thus be reduced. By contrast, the energy expenditure is theoretically increased in this case, but a person skilled in the art will have no particular difficulty in adapting the dimensions of the pallet assembly and of its fork to suit his own needs.

It will be noted that in the embodiment illustrated in FIG. 2, the first and second arms 15, 16 of the pallet assembly and the first and second additional arms 18, 19 are all situated in one and the same plane. However, other configurations are possible without departing from the scope of the present invention and notably according to the constraints that have to observed in terms of resonator bulkiness.

Figure 3:
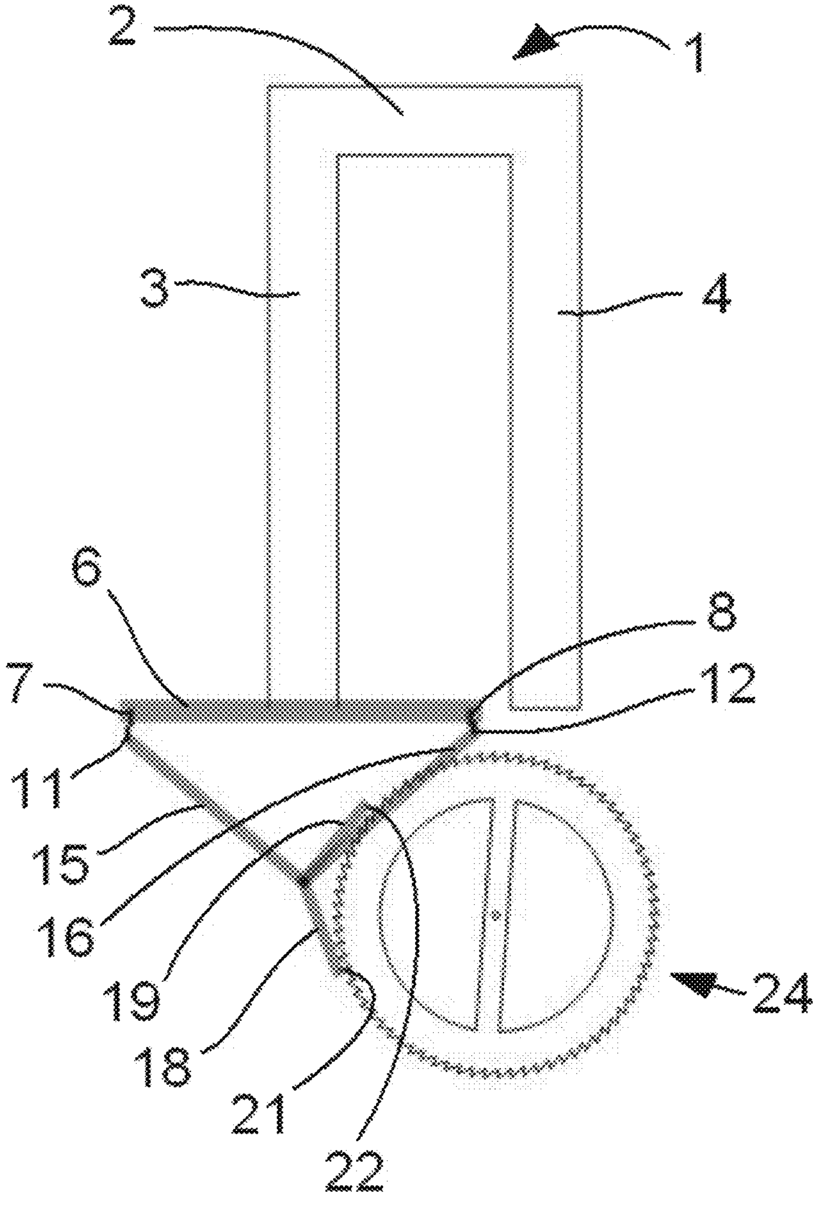
FIG. 3 is a schematic front view of a mechanical resonator for a clock movement according to a first alternative form of the resonator of FIG. 2.

FIG. 3 depicts a schematic front view of a mechanical resonator for a clock movement according to a first alternative form of the resonator of FIG. 2.

To make FIG. 3 easier to understand, use will be made of the same numerical references as in FIG. 2.

The resonator is the same overall as in FIG. 2, except that the first and second additional arms 18, 19 of the pallet assembly 10 extend in a second plane different from that containing the first and second arms 15, 16. Furthermore, in the embodiment of FIG. 3, the midlines, on the one hand, of the first and second arms and, on the other hand, of the first and second additional arms, make an angle of the order of 80 degrees between them.

By virtue of these features, the escapement wheel can be arranged in a different plane from that of the tuning fork and at a smaller distance away from it than was the case in the embodiment of FIG. 2.

Such a configuration makes it possible to reduce the bulkiness of the tuning fork-escapement assembly and is more suitable to be incorporated into a wristwatch.

A person skilled in the art will encounter no particular difficulty in modifying the shape of the pallet assembly to suit his own constraints in terms of bulkiness.

Figure 4:
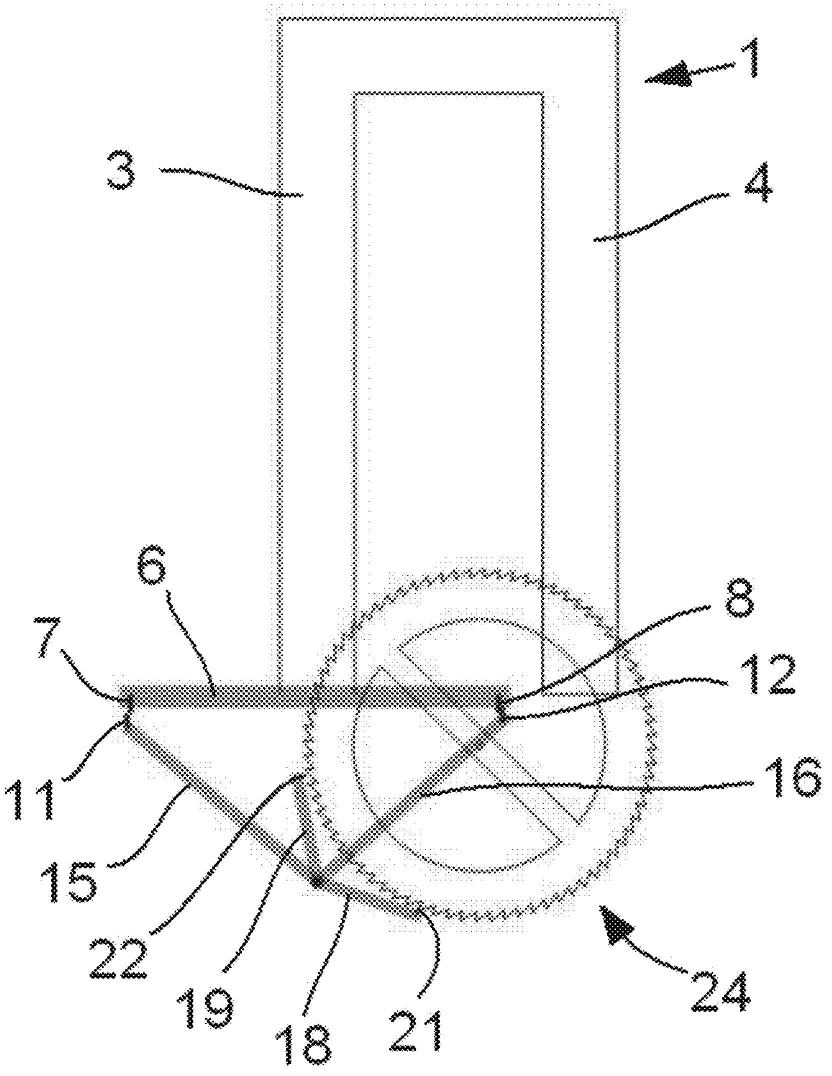
FIG. 4 is a schematic front view of a mechanical resonator for a clock movement according to a second alternative form of the resonator of FIG. 2.

FIG. 4 depicts a schematic front view of a mechanical resonator for a clock movement according to a second alternative form of the resonator of FIG. 2. In this alternative form, the midlines of the first and second arms 15, 16, on the one hand, and of the first and second additional arms 18, 19 on the other hand, make an angle of the order of 120 degrees between them.

Figure 5:
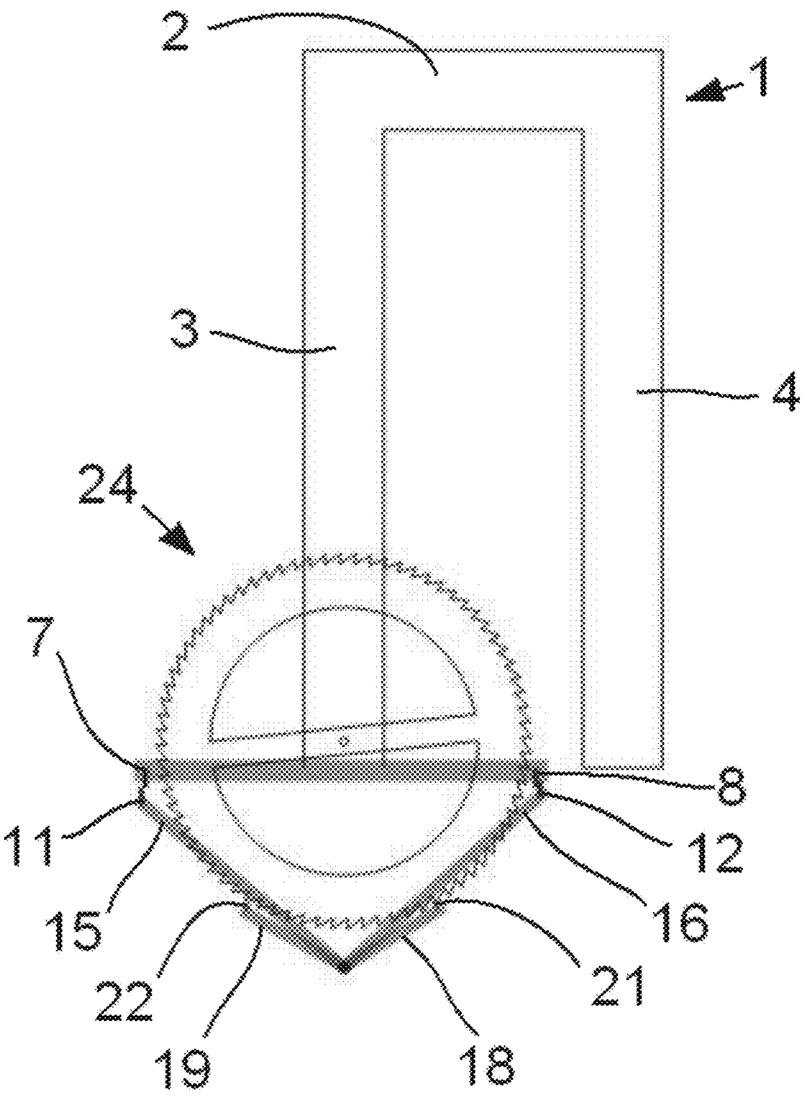
FIG. 5 is a schematic front view of a mechanical resonator for a clock movement according to a third alternative form of the resonator of FIG. 2.

FIG. 5 depicts a schematic front view of a mechanical resonator for a clock movement according to a third alternative form of the resonator of FIG. 2. In this alternative form, the midlines of the first and second arms 15, 16, on the one hand, and of the first and second additional arms 18, 19, on the other hand, make an angle of the order of 180 degrees between them.

It is evident from FIGS. 4 and 5 that the escapement wheel and the tuning fork may potentially be at least partially superposed, notably in order to reduce the bulkiness of the tuning fork-escapement assembly as mentioned hereinabove.

FIGS. 6*a*, 6*b*, 6*c*, 6*d* and 6*e* depict detailed views of the operation of the resonator of FIG. 2, in successive configurations that occur over a half cycle of the oscillations of the first prong 3.

Figure 6A:
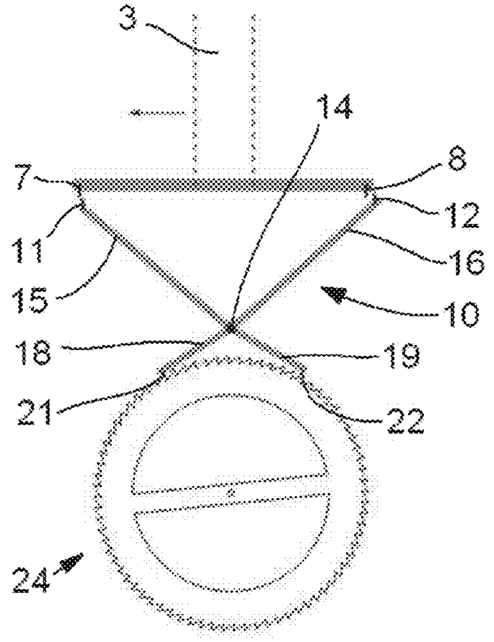

Starting from FIG. 6*a*, the first prong 3 of the tuning fork finishes its travel in the direction of the arrow, to the left of the figure, just before returning in the opposite direction.

In this situation, the first pallet 21 of the pallet assembly 10 collaborates with the toothset of the escapement wheel 24 to lock the latter in terms of rotation. The escapement here is at rest.

Figure 6B:
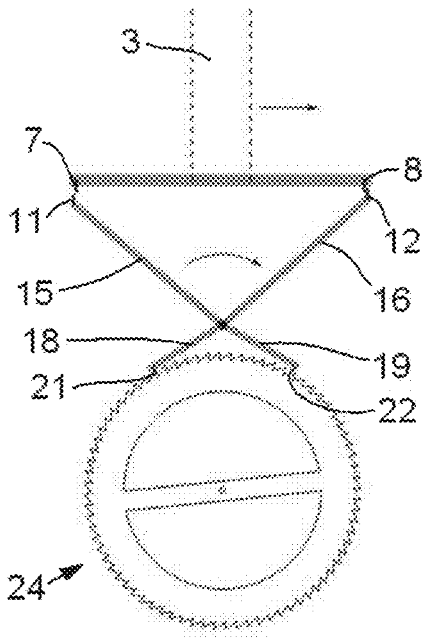

When the prong 3 returns toward the right of the illustration, something which is depicted in FIG. 6*b*, the second tooth 12 of the pallet assembly finds itself in the path of the second pin 8. When these two items make contact, an unlocking phase begins by rotation of the pallet assembly in the clockwise direction of FIG. 6*b*, under the effect of the impulse transmitted by the second pin. The first pallet 21 is lifted from the escapement wheel 24 and frees it.

Figure 6C:
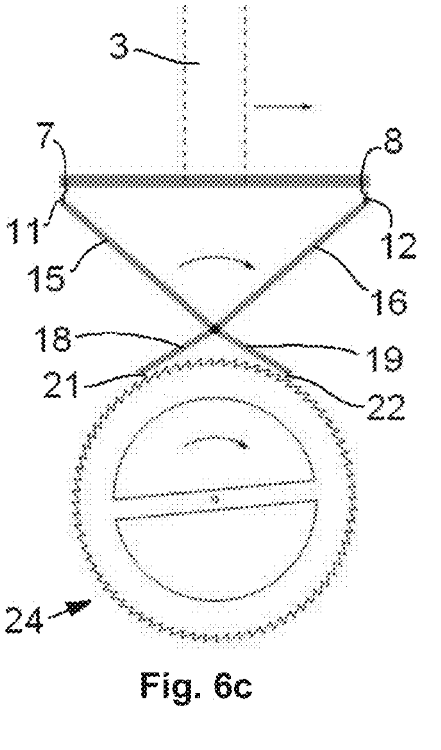

During the unlocking phase, the first tooth 11 rides up toward the first pin 7, this situation being illustrated in FIG. 6*c*.

Figure 6D:
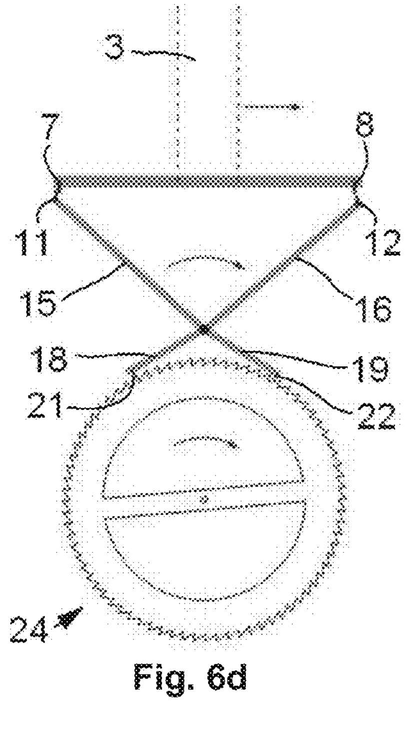

A phase of impulse from the pallet assembly to the first pin 7 then occurs, as illustrated in FIG. 6*d*, to ensure that the oscillations of the first prong 3 of the tuning fork are sustained.

At the same time, the second pallet 22 moves down toward the escapement wheel 24 until it locks it again, as depicted in FIG. 6*e*.

The second half cycle then beings and the same phases occur once again in the same chronological order, in the conventional way.

Thus it may be seen that for the pallet assembly 10 to collaborate efficiently with the escapement wheel 24, the greatest distance between the various positions that its teeth 11, 12 adopt needs to be great, in any event greater than twice the amplitude of the vibrations of the prong 3 of the tuning fork which, itself, is small as was revealed above, and not enough on its own to cause the pallet assembly to move satisfactorily. This greatest distance is the distance between the respective positions that the first and second teeth adopt after they have experienced the impulse from the corresponding pin during the unlocking phases.

In the foregoing figures, the resonator according to the invention comprises a conversion member comprising two pins 7, 8 associated with two teeth 11, 12 which are spaced apart to ensure sufficient rotation of the pallet assembly.

However, it is conceivable to produce the conversion member in different forms without departing from the scope of the present invention.

FIG. 7 depicts a schematic front view of a mechanical resonator for a clock movement according to a second embodiment of the present invention, that is able to culminate in a similar result.

The pallet assembly 100 here has a more conventional shape, with a fork 101 of a width that is reduced with reference to the one illustrated in the preceding figures.

Thus, the conversion member used in this embodiment uses the lever arm principle.

This comprises a lever 110 intended to be pivot mounted on a frame element of the clock movement, by means of a pivot 111.

The lever comprises, at a first end, a first pin 112 pivot mounted on the free end 5 of the first prong 3 of the tuning fork and, at a second end, a second pin 113 engaged between the teeth of the fork 101 to collaborate with this fork and cause the pallet assembly 100 to pivot when the first prong 3 vibrates.

It will be noted that here too, the maximum distance between the various positions that the teeth of the fork 101 can occupy is more than twice the amplitude of the vibrations of the prong 3 of the tuning fork. However, the structure of the conversion member makes it possible both to ensure good transmission of impulse from the pallet assembly to the tuning fork in order to sustain the oscillations of the latter and to ensure good transmission of impulse from the tuning fork to the pallet assembly in order to cause the latter to pivot at an amplitude that is able to ensure correct operation of the associated escapement. Specifically, the lever makes it possible to amplify the amplitude of vibration of the leg of the tuning fork. More specifically, in FIG. 6, the lever arm used is equal to the ratio of the distance between the second pin 113 and the pivot 111 to the distance between the first pin 112 and the pivot 111. By virtue of this device, a conventional pallet assembly can be used, provided a suitable arm ratio is provided.

While this solution is of more complex construction and suffers more rapid wear of the components involved than the first embodiment, it does, despite these things, allow the creation of a mechanical resonator that complies with the features of the invention.

The foregoing description has attempted to describe particular embodiments by way of nonlimiting illustration and the invention is not restricted to the implementation of certain specific features that have just been described, such as the specifically illustrated and described shape of the tuning fork, the escapement wheel or the pallet assembly for example.

For example, it will be noted that because of their smaller size than in conventional systems, by approximately one order of magnitude, the shape of the pallets ought to be modified in order to strengthen them. In particular, the rectangular cross section of conventional pallets is fragile as their width decreases, and so a trapezoidal cross section may be preferred. The thickness of the pallets may also be increased in order to strengthen them, in addition. The extra width must of course take into consideration the collaboration between the pallet and the toothset of the escapement wheel.

It is also possible to increase the draw of the pallets by securing them to the arms of the pallet assembly at a certain angle, other than the usual right angle. Such a draw affords a measure of safety by reducing the possibility of the escapement wheel to free itself accidentally during the phase of rest against the pallet.

A person skilled in the art will encounter no particular difficulty in adapting the content of this disclosure to suit his own purposes and produce a mechanical resonator different from the one according to the embodiments described here but comprising a conversion member that makes it possible to create a resonator with free escapement as described above, without departing from the scope of the present invention. In particular, to ensure correct operation of the resonator according to the present invention, the conversion member and the pallet assembly are preferably arranged in such a way that a lever arm is created between the pin of the tuning fork and the escapement wheel, so as to guarantee enough amplitude for the oscillations of the teeth of the pallet assembly.

It will further be noted, as mentioned hereinabove, that the invention is not restricted to a resonator comprising a single escapement wheel or a single pallet assembly. Specifically, a second escapement wheel could be associated with the pallet assembly or even with an additional pallet assembly collaborating with the second prong of the tuning fork.

Furthermore, it should be noted that the constraints on relative positioning of the various components of the resonator according to the present invention are strict, and so a person skilled in the art will be able to employ any suitable known means he considers to be of benefit in optimizing how the invention is embodied, for example flexible rotation guides for the rotary components of the resonator, particularly for the pallet assembly.

Finally, it will be noted that the technology used for the fabrication of silicon compounds lends itself particularly well to the production of the elements that have been described, notably because it guarantees good precision manufacture and because silicon elements in contact with one another exhibit low friction with reference to the materials commonly used in the field of horology. These specific features of silicon are magnified here because of the high vibrational frequency of the tuning fork.

What is claimed is:

1. A tuning-fork mechanical resonator for a mechanical clock movement with free escapement, comprising:

an oscillator of a tuning fork type, of which at least one first prong is intended to oscillate about a first axis and bears at least one first pin associated with at least one first fork tooth of a pallet assembly to cause this assembly to pivot between first and second angular positions and alternately lock and release an escapement wheel; and a conversion member secured to said first pin and designed to on the one hand, convert the oscillations of said first prong of said oscillator into rotational movements of said pallet assembly by transmitting first impulses thereto, and on the other hand, transmit mechanical energy from said pallet assembly to said first prong of said oscillator in the form of impulses, wherein said first tooth has an amplitude of axial movement, in substantially a direction of said first axis as said pallet assembly pivots, that is greater than the amplitude of movement of said first pin substantially in the direction of said first axis.

2. The mechanical resonator of claim 1, wherein said conversion member comprises a lever, intended to be pivot-mounted on a frame element of the clock movement and a first end of which is secured to said first pin so as to be able to pivot in relation to said first prong of said oscillator, said lever bearing a second pin intended to collaborate with said first tooth and with a second tooth of said fork in order to cause said pallet assembly to pivot.

3. The mechanical resonator of claim 2, further comprising a second escapement wheel associated with said pallet assembly.

4. The mechanical resonator of claim 2, further comprising a second escapement wheel associated with an additional pallet assembly designed to collaborate with the second prong of said oscillator.

5. The mechanical resonator of claim 1, wherein said conversion member comprises a support arranged on said first prong of said oscillator and bearing said first pin and a second pin, these pins being intended to collaborate alternately and respectively with said first fork tooth and with a second fork tooth and being situated at a relative distance that is smaller than the relative distance between said first and second fork teeth.

6. The mechanical resonator of claim 5, wherein said pallet assembly comprises a frame having first and second arms respectively bearing said first and second fork teeth.

7. The mechanical resonator of claim 6, said pallet assembly being secured to a pallet assembly staff intended for mounting it on the clock movement, wherein said first and second arms extend substantially from said pallet assembly staff.

8. The mechanical resonator of claim 7, said pallet assembly comprising first and second additional arms intended to collaborate alternately with said escapement wheel wherein said first and second arms and said first and second additional arms are all arranged in one and the same plane.

9. The mechanical resonator as claimed in of claim 7, said pallet assembly comprising first and second additional arms intended to collaborate alternately with said escapement wheel, wherein said first and second arms, on the one hand, and said first and second additional arms, on the other hand, are arranged in respective distinctive first and second planes.

10. The mechanical resonator of claim 5, further comprising a second escapement wheel associated with said pallet assembly.

11. The mechanical resonator of claim 5, further comprising a second escapement wheel associated with an additional pallet assembly designed to collaborate with the second prong of said oscillator.

12. The mechanical resonator of claim 1, further comprising a second escapement wheel associated with said pallet assembly.

13. The mechanical resonator of claim 1, further comprising a second escapement wheel associated with an additional pallet assembly designed to collaborate with the second prong of said oscillator.

14. The resonator of claim 1, wherein at least one of said oscillator, said pallet assembly, and said escapement wheel is made of silicon.

15. A clock movement comprising a tuning-fork mechanical resonator with free escapement, the tuning-fork mechanical resonator comprising an oscillator of a tuning fork type, of which at least one first prong is intended to oscillate about a first axis and bears at least one first pin associated with at least one first fork tooth of a pallet assembly to cause this assembly to pivot between first and second angular positions and alternately lock and release an escapement wheel; and a conversion member secured to said first pin and designed to, on the one hand, convert the oscillations of said first prong of said oscillator into rotational movements of said pallet assembly by transmitting first impulses thereto, and, on the other hand, transmit mechanical energy from said pallet assembly to said first prong of said oscillator in the form of impulses, wherein said first tooth has an amplitude of axial movement, in substantially a direction of said first axis, as said pallet assembly pivots, that is greater than the amplitude of movement of said first pin substantially in the direction of said first axis.

16. The clock movement of claim 15, wherein said conversion member comprises a lever, intended to be pivot-mounted on a frame element of the clock movement and a first end of which is secured to said first pin so as to be able to pivot in relation to said first prong of said oscillator, said lever bearing a second pin intended to collaborate with said first tooth and with a second tooth of said fork in order to cause said pallet assembly to pivot.

17. The clock movement of claim 15, wherein said conversion member comprises a support arranged on said first prong of said oscillator and bearing said first pin and a second pin, these pins being intended to collaborate alternately and respectively with said first fork tooth and with a second fork tooth and being situated at a relative distance that is smaller than the relative distance between said first and second fork teeth.

18. A timepiece comprising a clock movement comprising a tuning-fork mechanical resonator with free escapement, the tuning-fork mechanical resonator comprising an oscillator of the tuning fork type, of which at least one first prong is intended to oscillate about a first axis and bears at least one first pin associated with at least one first fork tooth of a pallet assembly to cause this assembly to pivot between first and second angular positions and alternately lock and release an escapement wheel; and a conversion member secured to said first pin and designed to, on the one hand, convert the oscillations of said first prong of said oscillator into rotational movements of said pallet assembly by transmitting first impulses thereto, and, on the other hand, transmit mechanical energy from said pallet assembly to said first prong of said oscillator in the form of impulses, wherein said first tooth has an amplitude of axial movement, in substantially a direction of said first axis, as said pallet assembly pivots, that is greater than the amplitude of movement of said first pin substantially in the direction of said first axis.

19. The timepiece of claim 18, wherein said conversion member comprises a lever, intended to be pivot-mounted on a frame element of the clock movement and a first end of which is secured to said first pin so as to be able to pivot in relation to said first prong of said oscillator, said lever bearing a second pin intended to collaborate with said first tooth and with a second tooth of said fork in order to cause said pallet assembly to pivot.

20. The timepiece of claim 18, wherein said conversion member comprises a support arranged on said first prong of said oscillator and bearing said first pin and a second pin, these pins being intended to collaborate alternately and respectively with said first fork tooth and with a second fork tooth and being situated at a relative distance that is smaller than the relative distance between said first and second fork teeth.

* * * * *

UNITED STATES PATENT AND TRADEMARK OFFICE

CERTIFICATE OF CORRECTION

PATENT NO. : 9,134,705 B2
APPLICATION NO. : 14/348317
DATED : September 15, 2015
INVENTOR(S) : Ilan Vardi It is certified that error appears in the above-identified patent and that said Letters Patent is hereby corrected as shown below:

In the Specification

Column 1, Line 11, delete “entirely” and insert -- entirety --

In the Claims

Column 12, Line 36, after “to” insert -- , --

Column 13, Line 15, Claim 8, delete “wheel” and insert -- wheel, --

Column 13, Line 18, Claim 9, after “resonator” delete “as claimed in”

Signed and Sealed this
Fifth Day of July, 2016

Michelle K. Lee
*Director of the United States Patent and Trademark Office*